(12) United States Patent
Morita et al.

(10) Patent No.: US 9,073,103 B2
(45) Date of Patent: Jul. 7, 2015

(54) LIQUID PROCESSING APPARATUS, LIQUID PROCESSING METHOD, AND RECORDING MEDIUM HAVING COMPUTER PROGRAM FOR PERFORMING THE SAME METHOD

(75) Inventors: Satoshi Morita, Koshi (JP); Nobuhiro Ogata, Koshi (JP); Shuichi Nagamine, Koshi (JP); Kenji Kiyota, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 939 days.

(21) Appl. No.: 13/161,236

(22) Filed: Jun. 15, 2011

(65) Prior Publication Data

US 2012/0227768 A1 Sep. 13, 2012

(30) Foreign Application Priority Data

Mar. 8, 2011 (JP) ................. 2011-050389

(51) Int. Cl.
*B08B 15/00* (2006.01)
*H01L 21/67* (2006.01)
(52) U.S. Cl.
CPC ........ *B08B 15/002* (2013.01); *H01L 21/67028* (2013.01); *H01L 21/67051* (2013.01); *H01L 21/67173* (2013.01)
(58) Field of Classification Search
None
See application file for complete search history.

(56) References Cited

U.S. PATENT DOCUMENTS

| | | | | |
|---|---|---|---|---|
| 2009/0017733 A1* | 1/2009 | Takahashi et al. | ............... | 451/57 |
| 2010/0040779 A1* | 2/2010 | Nagamine et al. | ............ | 427/240 |

FOREIGN PATENT DOCUMENTS

| | | | |
|---|---|---|---|
| JP | 07-037778 | A | 2/1995 |
| JP | 10-312952 | A | 11/1998 |
| JP | 11-003851 | A | 1/1999 |
| JP | 2008-034490 | A | 2/2008 |
| JP | 2009-252884 | A | 10/2009 |
| TW | 201100177 | A | 1/2011 |

\* cited by examiner

*Primary Examiner* — Michael Kornakov
*Assistant Examiner* — Ryan Coleman
(74) *Attorney, Agent, or Firm* — Abelman, Frayne & Schwab

(57) ABSTRACT

Disclosed is a liquid processing apparatus which includes: a plurality of liquid processing units to supply a processing liquid to an object to be processed and liquid-process the object; a common exhaust path to discharge atmospheres in the plurality of liquid processing units; an individual exhaust path to connect the common exhaust path with each of the liquid processing units; an opening-closing mechanism provided on the individual exhaust path to be openable; and an air injecting port to inject an air into the common exhaust path. An injection amount adjusting valve is provided on the common exhaust path to adjust the flow rate of the air injected from the air injecting port. A controller controls an opening degree of the injection amount adjusting valve based on an opening-closing state of the opening-closing mechanism.

13 Claims, 4 Drawing Sheets

LIQUID PROCESSING APPARATUS, LIQUID PROCESSING METHOD, AND RECORDING MEDIUM HAVING COMPUTER PROGRAM FOR PERFORMING THE SAME METHOD

CROSS-REFERENCE TO RELATED APPLICATIONS

This application is based on and claims priority from Japanese Patent Application No. 2011-050389, filed on Mar. 8, 2011, with the Japanese Patent Office, the disclosure of which is incorporated herein in its entirety by reference.

TECHNICAL FIELD

The present disclosure relates to a liquid processing apparatus, which is configured to liquid-process an object to be processed (e.g., a target object), a liquid processing method and a recording medium having a computer program for performing the same method.

BACKGROUND

In a manufacturing process of a semiconductor device, for example, a liquid processing process is known for removing particles or contaminants attached to a semiconductor wafer ("wafer") by supplying a processing liquid such as a chemical liquid or deionized water (DIW) onto the surface of an object to be processed such as a wafer. A liquid processing apparatus performs the liquid processing by supplying the processing liquid onto the surface of the wafer while rotating the wafer. This kind of liquid processing apparatus includes, for example, a plurality of liquid processing units (e.g., 4 to 5 liquid processing sections) that can perform the same kind of liquid processing, transports the wafer to each of the liquid processing units by using a common transportation mechanism, and allows the plurality of liquid processing units to simultaneously perform the liquid processing of the wafer, in order to increase the number of processed wafers (throughput) per unit hour.

The liquid processing unit as described above includes, for example, a spin chuck placing and rotating the wafer and a cup provided to surround the wafer held on the spin chuck and collecting the processing liquid supplied and scattered onto the surface of the wafer. As the processing liquid, an acid chemical liquid or an alkaline chemical liquid may be used and a chemical liquid is selectively supplied to wafer W depending on the processing to be performed.

Japanese Patent Laid-Open Publication No. 2008-34490 discloses a liquid processing apparatus including a plurality of liquid processing units that are placed horizontally, and an exhaust line for an acid chemical liquid and an exhaust line for an alkaline chemical liquid. For example, on the exhaust line for the acid chemical liquid, an acid exhaust duct discharging an atmosphere in the liquid processing unit in acid processing for each of the liquid processing units is connected to each of the liquid processing units, an acid exhaust pipe is connected to each acid exhaust duct, and the atmosphere in each of the liquid processing units is collectively discharged by the acid exhaust pipe through each acid exhaust duct. Further, a valve which is opened and closed depending on the kind of the liquid processing in the corresponding liquid processing unit is provided in each acid exhaust duct. In addition, clean air flows into each of the liquid processing units from an airflow injection portion at all times and the cleanliness is maintained in each of the liquid processing units.

SUMMARY

An exemplary embodiment of the present invention provides a liquid processing apparatus including: a plurality of liquid processing units that supply a processing liquid to an object to be processed and liquid-process the object; a common exhaust path that discharges atmospheres in the plurality of liquid processing units; an individual exhaust path that connects the common exhaust path with each of the liquid processing units; an opening-closing mechanism provided on the individual exhaust path to be openable; an air injecting port that injects an air into the common exhaust path; an injection amount adjusting valve that adjusts flow rate of the air injected from the air injecting port and is provided on the common exhaust path; and a controller that controls an opening degree of the injection amount adjusting valve based on an opening-closing state of the opening-closing mechanism.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
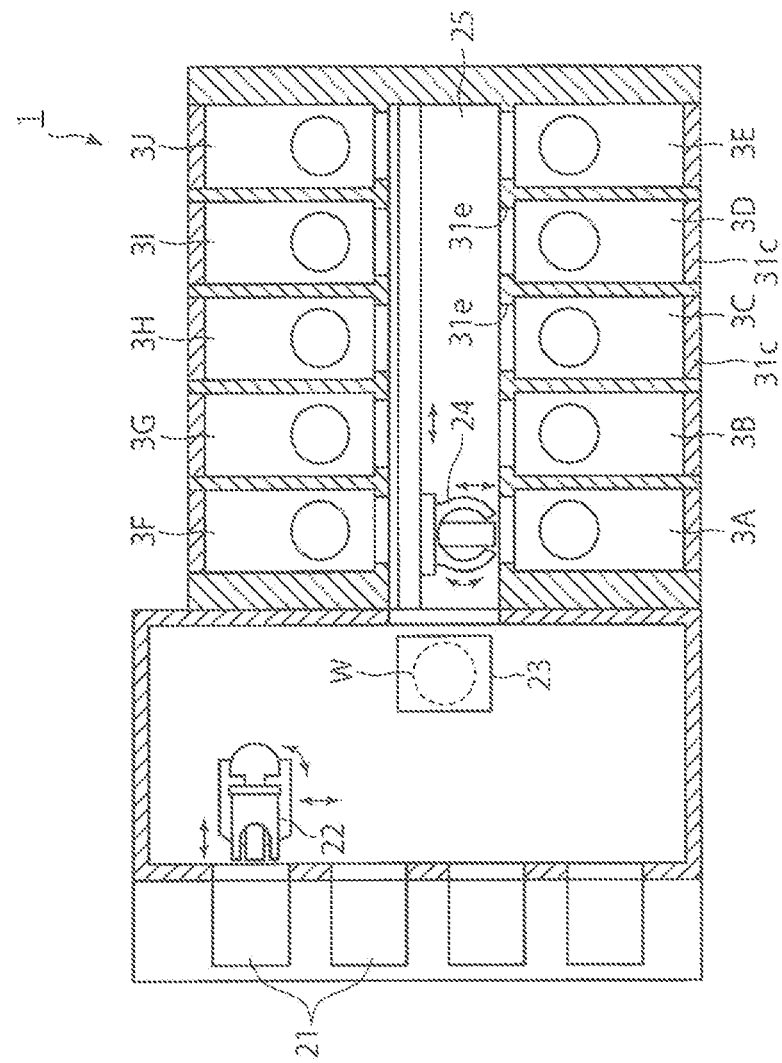
FIG. 1 is a transverse plan view illustrating one example of a liquid processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the above-mentioned liquid processing apparatus, an exhaust amount of the acid exhaust pipe is uniform. Therefore, when one of the valves provided on each acid exhaust duct is closed, there is a problem in that the exhaust amounts of liquid processing units corresponding to other valves increase and the pressures in the liquid processing units vary and decrease. In this case, air is injected into the liquid processing units from the outside, and as a result, there is a possibility that the cleanliness in the liquid processing units will deteriorate.

The present disclosure has been made in an effort to provide a liquid processing apparatus capable of suppressing the pressure fluctuation in a liquid processing section liquid-processing an object to be processed, a liquid processing method, and a recording medium having a computer program for performing the same method.

An exemplary embodiment of the present disclosure provides a liquid processing apparatus including: a plurality of liquid processing units to supply a processing liquid to an object to be processed and liquid-process the object; a common exhaust path to discharge atmospheres in the plurality of liquid processing units; an individual exhaust path to connect the common exhaust path with each of the liquid processing units; an opening-closing mechanism provided on the individual exhaust path to be openable; an air injecting port to inject an air into the common exhaust path; an injection amount adjusting valve to adjust the flow rate of the air injected from the air injecting port, which is provided on the common exhaust path; and a controller to control an opening degree of the injection amount adjusting valve based on an opening-closing state of the opening-closing mechanisms.

In the liquid processing apparatus, the injection amount adjusting valve may be placed at an exhaust-direction upstream side of a confluence of the exhausted air from each of the liquid processing units on the common exhaust path.

In the liquid processing apparatus, the liquid processing units may be configured to selectively supply plural kinds of processing liquids to the object, the common exhaust path may have a plurality of exclusive common exhaust paths discharging the atmospheres in the liquid processing units for each of the processing liquids supplied to the object in the liquid processing units, the individual exhaust path may be configured to connect the plurality of exclusive common exhaust paths with the liquid processing unit corresponding to the individual exhaust path, the opening-closing mechanism may have a flow path switching mechanism switching and connecting the liquid processing unit to the exclusive common exhaust path corresponding to the processing liquid supplied to the object, the air injecting port injecting the air may be provided on each of the exclusive common exhaust paths, the injection amount adjusting valve adjusting the flow rate of the air injected from the air injecting port may be provided on each of the exclusive common exhaust paths, and the controller may control the opening degree of the injection amount adjusting valve based on a switching state of the flow path switching mechanism.

The liquid processing apparatus may further include a single gas supplying unit to supply gas to each of the liquid processing units.

In the liquid processing apparatus, each of the liquid processing units may include a liquid processing container forming a liquid processing space where the object is liquid-processed, an opening-closing panel provided in the liquid processing container to be openable and capable of opening the liquid processing space, and a panel detecting unit detecting the opening and closing of the opening-closing panel. When the panel detecting unit detects that the opening-closing panel is opened, the controller may control the corresponding opening-closing mechanism to be opened.

Another exemplary embodiment of the present disclosure provides a liquid processing method by using a liquid processing apparatus including a plurality of liquid processing units to supply a processing liquid to an object to be processed and liquid-process the object, a common exhaust path to discharge atmospheres in the plurality of liquid processing units, an individual exhaust path to connect the common exhaust path with each of the liquid processing units, an opening-closing mechanism provided on the individual exhaust path, an air injecting port to inject an air into the common exhaust path, and an injection amount adjusting valve to adjust flow rate of the air injected from the air injecting port, which is provided on the common exhaust path. The method includes carrying the object into at least one of the liquid processing units; and liquid-processing the object by supplying the processing liquid to the object in at least one of the liquid processing units into which the object is carried. Further, in the liquid-processing of the object, the atmospheres of the liquid processing units may be discharged through the individual exhaust path and the common exhaust path and an opening degree of the injection amount adjusting valve is adjusted based on an opening-closing state of the opening-closing mechanism.

In the liquid processing method, the injection amount adjusting valve may be placed at an exhaust-direction upstream side of a confluence of the exhausted air from each of the liquid processing units on the common exhaust path.

In the liquid processing method, each of the liquid processing units may be configured to selectively supply plural kinds of processing liquids to the object, the common exhaust path may have a plurality of exclusive common exhaust paths discharging the atmospheres in the liquid processing units for each of the processing liquids supplied to the object in the liquid processing units, the individual exhaust path may be configured to connect the liquid processing unit corresponding to the individual exhaust path with the plurality of exclusive common exhaust paths. The opening-closing mechanism may have a flow path switching mechanism switching and connecting the liquid processing unit to the exclusive common exhaust path corresponding to the processing liquid supplied to the object, the air injecting port injecting the air may be provided on each of the exclusive common exhaust paths, the injection amount adjusting valve adjusting the flow rate of the air injected from the air injecting port may be provided on the exclusive common exhaust path. And, in the liquid-processing of the object, the opening degree of each injection amount adjusting valve may be adjusted based on a switching state of the flow path switching mechanism.

In the liquid processing method, gas may be supplied from a single gas supplying unit to each of the liquid processing units, in the liquid-processing of the object.

In the liquid processing method, each of the liquid processing units may include a liquid processing container forming a liquid processing space where the object is liquid-processed, an opening-closing panel provided in the liquid processing container to be openable and capable of opening the liquid processing space, and a panel detecting unit detecting the opening and closing of the opening-closing panel. And in the liquid-processing of the object, when the panel detecting unit detects that the opening-closing panel is opened, the corresponding opening-closing mechanism may be controlled to be opened.

Yet another exemplary embodiment of the present disclosure provides a recording medium having a computer program for performing a liquid processing method in which the liquid processing method includes carrying an object to be processed into at least one of the liquid processing units and liquid-processing the object by supplying a processing liquid to the object in the liquid processing units into which the object is carried, by using a liquid processing apparatus. The liquid processing apparatus includes a plurality of liquid processing units to supply the processing liquid to the object and liquid-process the object, a common exhaust path to discharge atmospheres in the plurality of liquid processing units, an individual exhaust path to connect the common exhaust path with each of the liquid processing units, an opening-closing mechanism provided on the individual exhaust path, an air injecting port to inject an air into the common exhaust path, and an injection amount adjusting valve to adjust the flow rate of the air injected from the air injecting port, which is provided on the common exhaust path. Further, in the liquid-processing of the object, the atmospheres of the liquid processing units are discharged through the individual exhaust path and the common exhaust path and an opening degree of the injection amount adjusting valve is adjusted based on an opening-closing state of the opening-closing mechanism.

According to the exemplary embodiments of the present disclosure, it is possible to suppress pressure fluctuation in a liquid processing unit performing liquid-processing an object to be processed.

Hereinafter, a liquid processing apparatus, a liquid processing method, and a recording medium having a computer program for performing the same method according to exemplary embodiments of the present disclosure will be described with reference to the figures. First, referring to FIG. 1, an overall configuration of a liquid processing apparatus 1 will be described.

As shown in FIG. 1, liquid processing apparatus 1 includes a plurality of placing stands 21 for placing a carrier accommodating a plurality of wafers W to be processed, a transportation arm 22 for taking out wafer W from the carrier placed in placing stand 21, a rack unit 23 on which wafer W taken out by the transportation arm is placed, and a transportation arm 24 receiving wafer W placed on rack unit 23 and transporting wafer W to the inside of each liquid processing unit 3 to be described below. Among them, transportation arm 24 is configured to move on a transportation path 25 and a plurality of liquid processing units 3 (3A to 3J) constituting a liquid processing section are provided at both sides of transportation path 25. In this way, transportation arm 24 moves between rack unit 23 and each liquid processing unit 3 and allows wafer W to be carried in and out with respect to liquid processing unit 3.

Figure 2:
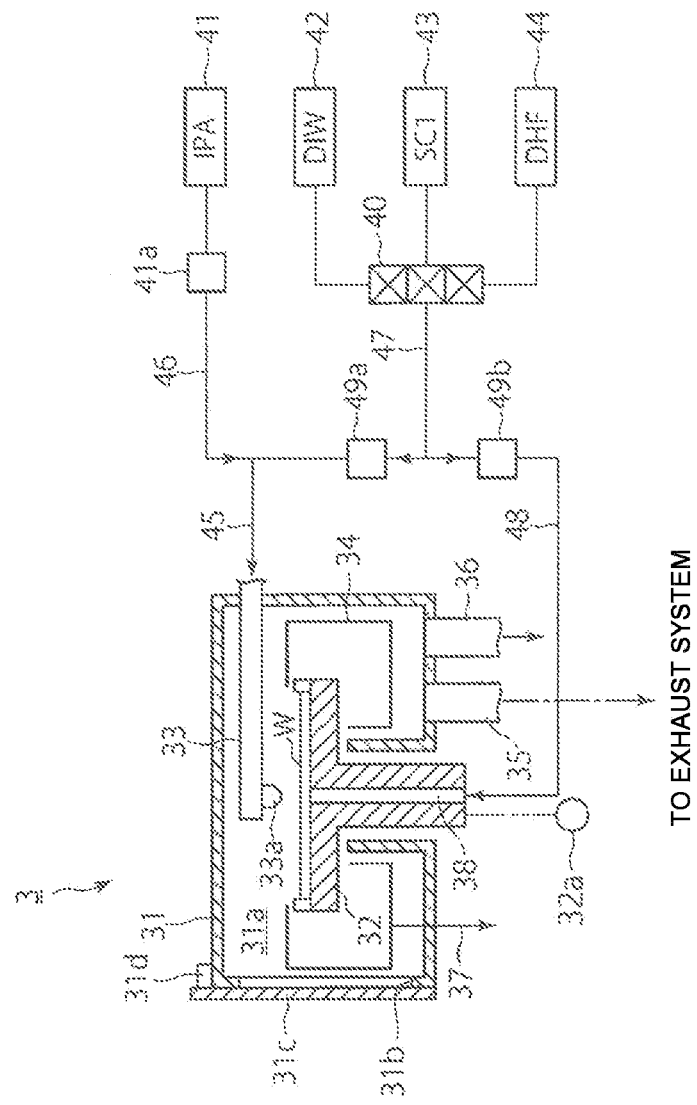
FIG. 2 is a schematic diagram illustrating the configuration of a liquid processing unit in the liquid processing apparatus according to the exemplary embodiment of the present disclosure.

Next, referring to FIG. 2, the configuration of liquid processing unit 3 will be described. Liquid processing unit 3 is configured to selectively supply plural kinds of processing liquids to wafer W and liquid-process wafer W in a single sheet type. Liquid processing unit 3 includes an outer chamber 31 (e.g., a liquid processing container) which forms a sealed liquid processing space 31a where wafer W is liquid-processed and has an opening 31b. Liquid processing unit 3 further includes an opening-closing panel 31c which is provided in outer chamber 31 to be openable and can open liquid processing space 31a through opening 31b, and a panel detecting unit 31d that detects the opening and closing of opening-closing panel 31c. Among them, panel detecting unit 31d may be attached to outer chamber 31 or may be attached to opening-closing panel 31c. Further, a controller 100 (see, e.g., FIG. 3) to be described below is connected to each panel detecting unit 31d. In addition, as shown in FIG. 1, a wafer carry in-out port 31e through which wafer W is carried in and out is provided in outer chamber 31.

Outer chamber 31 is provided with a wafer holding mechanism 32 rotating wafer W while holding wafer W substantially horizontally in liquid processing space 31a. A rotation driving unit 32a driving wafer holding mechanism 32 is connected to wafer holding mechanism 32. Further, a nozzle arm 33 selectively supplying the processing liquid onto the top surface of wafer W held on wafer holding mechanism 32 is provided in the upper part of wafer holding mechanism 32 and an inner cup 34 for receiving a chemical liquid (a processing liquid) scattered to the periphery from rotating wafer W is provided on the periphery of wafer holding mechanism 32.

Wafer W is carried in and out with respect to outer chamber 31 through wafer carry in-out port 31e by transportation arm 24 (see, e.g., FIG. 1). An individual exhaust path 35 for discharging the atmosphere in outer chamber 31 for each liquid processing unit 3 is connected to the bottom surface of outer chamber 31 and a drainage path 36 for discharging a liquid such as DIW liquid stored in the bottom surface of outer chamber 31 is provided on the bottom surface of outer chamber 31. Herein, it is noted that although individual exhaust path 35 is connected to the bottom surface of outer chamber 31 in the exemplary embodiment, a connection position with individual exhaust path 35 is not limited to the bottom surface of outer chamber 31 if the connection position is a position which enables the atmosphere in processing space 31a to be discharged. Inner cup 34 is provided with a liquid draining path 37 discharging the chemical liquid scattered from wafer W and received by inner cup 34. Further, a chemical liquid supplying path 38 is formed in wafer holding mechanism 32 and the chemical liquid is supplied to the bottom surface of rotating wafer W through chemical liquid supplying path 38.

A processing liquid supplying nozzle 33a is provided at the front end of nozzle arm 33. An IPA supplying unit 41, a DIW supplying unit 42, an SC1 supplying unit 43, and a DHF supplying unit 44 are connected to nozzle 33a through supplying paths 45, 46, and 47. Further, DIW supplying unit 42, SC1 supplying unit 43, and DHF supplying unit 44 are connected even to supplying path 38 of wafer holding mechanism 32 through supplying paths 47 and 48.

IPA supplying unit 41 supplies an isopropyl alcohol (IPA) liquid for drying wafer W by using high volatility and DIW supplying unit 42 supplies a deionized water (DIW) liquid which is a rinse liquid (a processing liquid) for removing the chemical liquid that remains on wafer W after the chemical liquid processing. Further, SC1 supplying unit 43 supplies an SC1 liquid (a mixture of ammonia and hydrogen peroxide) which is the chemical liquid for removing particles or organic contaminants from the surface of wafer W and DHF supplying unit 44 supplies a diluted hydrofluoric acid (DHF) liquid for removing a natural oxide film from the surface of wafer W. In the figure, reference numeral 41a represents a mass flow controller controlling a supply amount of the IPA liquid to nozzle 33a, reference numeral 40 represents a switching valve, and reference numerals 49a and 49b represent mass-flow controllers controlling a supply amount of the processing liquid to nozzle arm 33 side and wafer holding mechanism 32 side, respectively. Herein, among the chemical liquids, the IPA liquid corresponds to an organic chemical liquid, the DHF liquid corresponds to an acid chemical liquid, and the SC1 liquid corresponds to an alkaline chemical liquid.

Continually, an exhaust system of liquid processing unit 3 will be described. Although, in the exemplary embodiment, for example, five (5) liquid processing units 3 are arranged at each of both sides of transportation path 25 as shown in FIG. 1, but the exhaust system corresponding to liquid processing units 3A to 3E is substantially the same as the exhaust system corresponding to liquid processing units 3F to 3J. Therefore, the exhaust system corresponding to liquid processing units 3A to 3E will be herein described.

Figure 3:
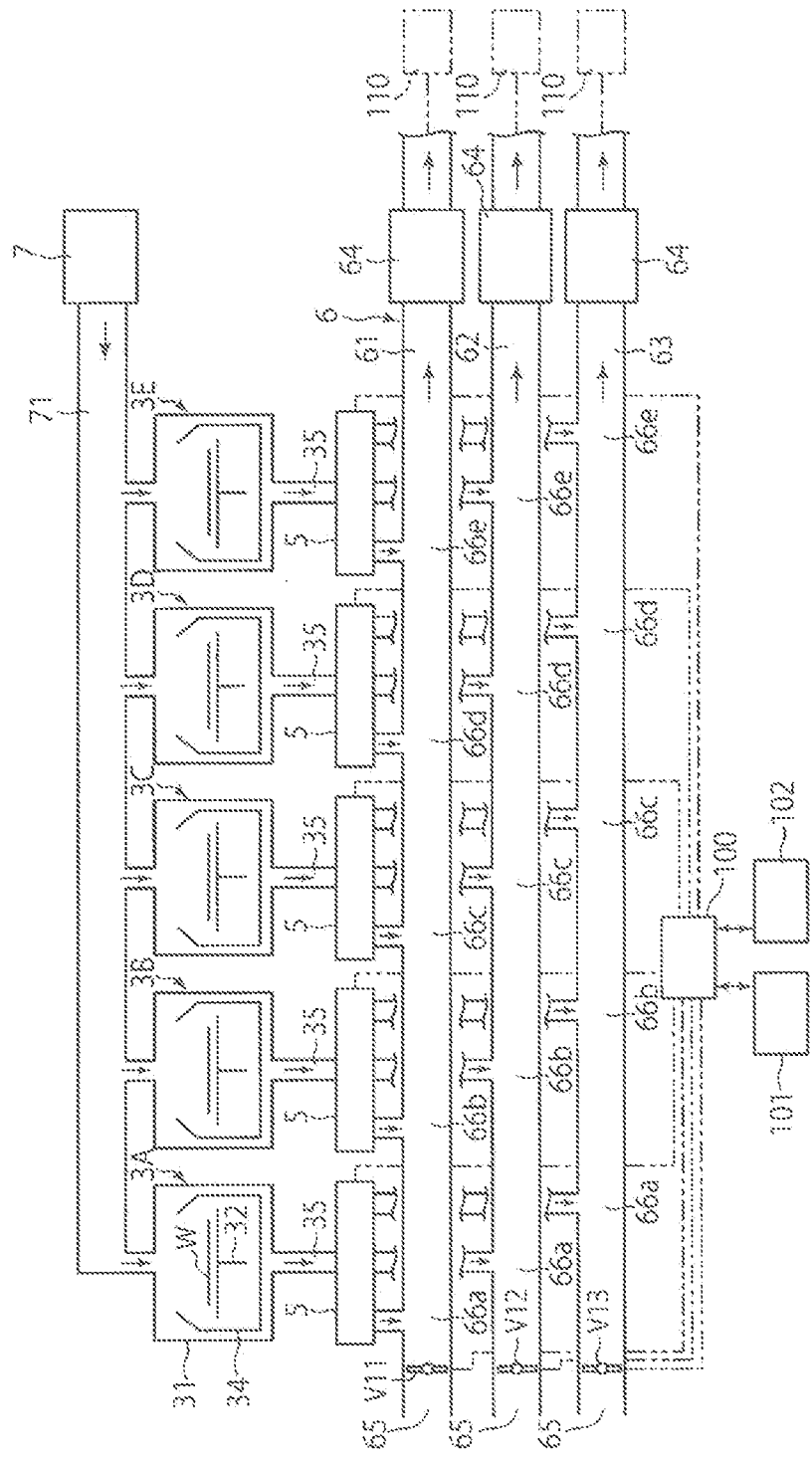
FIG. 3 is a schematic diagram illustrating an exhaust system according to the exemplary embodiment of the present disclosure.

As shown in FIG. 3, a common exhaust path 6 discharging the atmosphere in outer chamber 31 of liquid processing unit 3 is connected to each liquid processing unit 3 through individual exhaust path 35. Common exhaust path 6 includes a plurality of exclusive common exhaust paths 61 to 63 discharging the atmosphere in outer chamber 31 of liquid processing unit 3 for each type of the processing liquid supplied to wafer W in liquid processing unit 3. That is, in the exemplary embodiment as shown in FIG. 3, common exhaust path 6 includes a first exclusive common exhaust path 61 discharging the atmosphere in outer chamber 31 during a drying processing, a second exclusive common exhaust path 62 discharging the atmosphere in outer chamber 31 during an alkaline chemical liquid processing, and a third exclusive common exhaust path 63 discharging the atmosphere in outer chamber 31 during an acid chemical liquid processing. In addition, each individual exhaust path 35 connects the corresponding liquid processing unit 3 with each of exclusive common exhaust paths 61 to 63.

An exhaust damper 64 for adjusting an exhaust amount from the inside of outer chamber 31 of each liquid processing unit 3 is provided on each of exclusive common exhaust paths 61 to 63. Each exhaust damper 64 is connected to controller 100 and the exhaust amount from the inside of outer chamber 31 of liquid processing unit 3 can be set to a predetermined amount based on a command from controller 100.

Further, an exhaust driving unit 110 provided outside liquid processing apparatus 1 is connected to each of exclusive common exhaust paths 61 to 63 at an exhaust-direction downstream side of exhaust damper 64. Exhaust driving unit 110 sucks the inside of each of exclusive common exhaust paths 61 to 63, discharges the atmosphere in each outer chamber 31, and sends the atmosphere to a collection facility (not shown). In addition, FIG. 3 is a pattern diagram clearly illustrating the flow of the exhausted air from each liquid processing unit 3 and does not describe an actual layout of each of exclusive common exhaust paths 61 to 63. Each of exclusive common exhaust paths 61 to 63 may be arbitrarily placed.

An opening-closing mechanism 5 is provided on each individual exhaust path 35 to be openable. In the exemplary embodiment, opening-closing mechanism 5 includes a flow path switching mechanism 5 that switches and connects liquid processing unit 3 to each of exclusive common exhaust paths 61 to 63 corresponding to the processing liquid supplied to wafer W in liquid processing unit 3. Flow path switching mechanism 5 is configured to switch the flow path by selectively opening and closing each flow path connecting liquid processing unit 3 with each of exclusive common exhaust paths 61 to 63. Flow path switching mechanism 5 may be configured by three (3) opening-closing valves, for example like switching valve 40, as shown in FIG. 2 (although the flow of a fluid is opposite) or may have a structure having the same function as the three (3) opening-closing valves. Further, controller 100 is connected to each flow path switching mechanism 5 and each flow path switching mechanism 5 is controlled based on a command from controller 100.

An air injecting port 65 injecting an air is provided on each of exclusive common exhaust paths 61 to 63. Each air injecting port 65 is provided at an opposite end to exhaust driving unit 110 on each of corresponding exclusive common exhaust paths 61 to 63, as shown in FIG. 3. Further, air injecting port 65 may be configured by opening the end of each of exclusive common exhaust paths 61 to 63 with respect to the air.

Further, injection amount adjusting valves V11 to V13 controlling the flow rate of the air injected from air injecting port 65 are provided on each of exclusive common exhaust paths 61 to 63. Specifically, a first injection amount adjusting valve V11 is provided on first exclusive common exhaust path 61, a second injection amount adjusting valve V12 is provided on second exclusive common exhaust path 62, and a third injection amount adjusting valve V13 is provided on third exclusive common exhaust path 63. Each of injection amount adjusting valves V11 to V13 is placed at an upstream side of an exhaust direction indicated by an arrow of FIG. 3 of confluences 66a to 66e of the exhausted airs from each liquid processing unit 3, on each of corresponding exclusive common exhaust paths 61 to 63. That is, the exhausted air from each of liquid processing units 3A to 3E is joined at confluences 66a to 66e on each of exclusive common exhaust paths 61 to 63. Each of injection amount adjusting valves V11 to V13 is placed at the exhaust-direction upstream side of confluence 66a placed at the exhaust-direction upstream side among confluences 66a to 66e. In addition, air injecting port 65 is placed at the exhaust-direction upstream side of each of injection amount adjusting valves V11 to V13. Further, controller 100 is connected to each of injection amount adjusting valves V11 to V13 and the opening degree of each of injection amount adjusting valves V11 to V13 is controlled based on a command from controller 100. Moreover, each of injection amount adjusting valves V11 to V13 may be configured by, for example, a butterfly valve.

A single fan filter unit (FFU) 7 (a gas supplying unit) supplying a clean air (e.g., gas) to outer chamber 31 as a downflow is connected to each liquid processing unit 3. Each outer chamber 31 and fan filter unit 7 are connected with each other through a gas supplying channel 71 and the clean gas from fan filter unit 7 is supplied into each outer chamber 31 through gas supplying channel 71. In this way, gas evaporated and vaporized from the chemical liquid is prevented from ascending and being diffused to thereby maintain the cleanliness in each liquid processing container 3. Further, fan filter unit 7 is connected to controller 100 and the flow rate of the supplied clean air is controlled based on a command from controller 100.

As described above, controller 100 is connected to flow path switching mechanism 5 and injection amount adjusting valves V11 to V13. Controller 100 controls the opening degree of each of injection amount adjusting valves V11 to V13 based on the switching state of each flow path switching mechanism 5. For example, controller 100 may control first injection amount adjusting valve V11 to increase the opening degree of first injection amount adjusting valve V11 as the number of liquid processing units 3 connected to first exclusive common exhaust path 61 decreases. Specifically, when five (5) individual exhaust paths 35 are connected to first exclusive common exhaust path 61, controller 100 adjusts the opening degree of first injection amount adjusting valve V11 to a first opening degree. When four (4) individual exhaust paths 35 are connected to first exclusive common exhaust path 61, controller 100 adjusts the opening degree of first injection amount adjusting valve V11 to a second opening degree. Similarly, when three (3) individual exhaust paths 35 are connected to first exclusive common exhaust path 61, controller 100 adjusts the opening degree of first injection amount adjusting valve V11 to a third opening degree, when two (2) individual exhaust paths 35 are connected to first exclusive common exhaust path 61, controller 100 adjusts the opening degree of first injection amount adjusting valve V11 to a fourth opening degree, when one (1) individual exhaust path 35 is connected to first exclusive common exhaust path 61, controller 100 adjusts the opening degree of first injection amount adjusting valve V11 to a fifth opening degree, and when no individual exhaust path 35 is connected to first exclusive common exhaust path 61, controller 100 adjusts the opening degree of first injection amount adjusting valve V11 to a sixth opening degree. Herein, the relationship among the opening degrees is as follows: the first opening degree<the second opening degree<the third opening degree<the fourth opening degree<the fifth opening degree<the sixth opening degree. In this way, the fluctuation in the exhaust amount from outer chamber 31 of liquid processing unit 3 connected to first exclusive common exhaust path 61 is suppressed by adjusting the flow rate of the air injected from air injecting port 65. Further, controller 100 adjusts each opening degree even with respect to second injection amount adjusting valve V12 and third injection amount adjusting valve V13 in the same manner as first injection amount adjusting valve V11.

When panel detecting unit 31d detects that opening-closing panel 31c is opened, controller 100 controls corresponding flow path switching mechanism 5. That is, when panel detecting unit 31d detects that opening-closing panel 31c is opened, controller 100 controls flow path switching mechanism 5 to open corresponding opening-closing mechanism 5, that is, to allow corresponding liquid processing unit 3 and one of exclusive common exhaust paths 61 to 63 to be in communication with each other. In this case, controller 100 controls the switching state of flow path switching mechanism 5 as described above to reflect the switching state to the adjustment of the opening degrees of injection amount adjusting valves V11 to V13.

Further, controller 100 also controls fan filter unit 7 and exhaust damper 64 and controls an internal pressure of outer chamber 31 of each liquid processing unit 3 to be maintained at a predetermined pressure (e.g., atmospheric pressure).

However, as shown in FIG. 3, an input-output device 101 constituted by a keyboard performing an input operation of a command or a display visualizing and displaying an operational status of liquid processing apparatus 1 is connected to controller 100 in order to allow a process manager to manage liquid processing apparatus 1. Further, controller 100 is accessible to a recording medium 102 having a program for implementing the processing executed by liquid processing apparatus 1. Recording medium 102 may be constituted by known recording media including memories such as a ROM and a RAM and disk-type recording media such as a hard disk, a CD-ROM, a DVD-ROM, and a flexible disk. Therefore, controller 100 executes the program prerecorded in recording medium 102 to allow liquid processing apparatus 1 to process wafer W.

Next, an operation of the exemplary embodiment having the above configuration, that is, a liquid processing method according to an exemplary embodiment will be described. Further, operations of components for executing the liquid processing method to be described below are controlled by a control signal from controller 100 based on the program prerecorded in recording medium 102.

Figure 4:
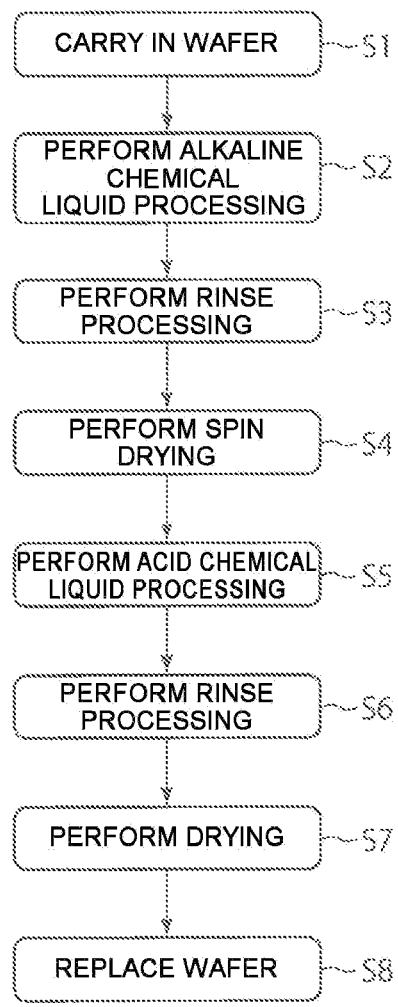
FIG. 4 is a diagram describing a liquid processing method according to another exemplary embodiment of the present disclosure.

First, as shown in FIG. 4, wafer W is carried into liquid processing unit 3 (step S1). In this case, first, as shown in FIG. 1, the carrier receiving wafer W is placed on placing stand 21 and wafer W is taken out from the inside of the carrier by transportation arm 22 to be placed on rack unit 23. Continuously, transportation arm 24 receives wafer W from rack unit 23 and carries wafer W into outer chamber 31 of predetermined liquid processing unit 3 through wafer carry in-out port 31e and thereafter, wafer W is transferred and held onto wafer holding mechanism 32.

Continuously, nozzle 33a of nozzle arm 33 moves to the upper side of wafer W held on wafer holding mechanism 32. Further, outer chamber 31 of liquid processing unit 3 is switched and connected to second exclusive common exhaust path 62 by flow path switching mechanism 5, wafer holding mechanism 32 is driven by rotation driving unit 32a, and wafer W rotates. In addition, while the liquid processing of wafer W to be described below is performed, exhaust driving unit 110 is continuously driven.

Next, in liquid processing unit 3, various kinds of processing liquids are selectively supplied to wafer W and wafer W is liquid-processed.

First, wafer W is processed with the alkaline chemical liquid (step S2). In this case, the SC1 liquid is supplied to the top and bottom surfaces of wafer W by nozzle 33a and chemical liquid supplying path 38. As a result, the top and bottom surfaces of wafer W are alkali-washed. During this period, the atmosphere in outer chamber 31 is discharged through individual exhaust path 35 and second exclusive common exhaust path 62. Further, the SC1 liquid is scattered in outer chamber 31 by the rotation of wafer W. As a result, the atmosphere in outer chamber 31 is discharged together with the mist of the SC1 liquid.

After the alkaline chemical liquid processing is terminated, the DIW liquid is supplied to the top and bottom surfaces of wafer W by nozzle 33a and chemical liquid supplying path 38 and wafer W is rinse-processed (step S3). Thereafter, spin-drying is performed (step S4).

Next, outer chamber 31 is switched and connected to third exclusive common exhaust path 63 by flow path switching mechanism 5.

Continuously, wafer W is processed with the acid chemical liquid (step S5). In this case, the DHF liquid is supplied to the top and bottom surfaces of wafer W by nozzle 33a and chemical liquid supplying path 38. As a result, the top and bottom surfaces of wafer W are acid-washed. During this period, the atmosphere in outer chamber 31 is discharged through individual exhaust path 35 and third exclusive common exhaust path 63. Further, the DHF liquid is scattered in outer chamber 31 by the rotation of wafer W. As a result, the atmosphere in outer chamber 31 is discharged together with the mist of the DHF liquid.

After the acid chemical liquid processing is terminated, the DIW liquid is supplied to the top and bottom surfaces of wafer W by nozzle 33a and chemical liquid supplying path 38 and wafer W is rinse-processed (step S6).

Thereafter, outer chamber 31 is switched and connected to first exclusive common exhaust path 61 by flow path switching mechanism 5.

Continuously, wafer W is dried (step S7). In this case, the IPA liquid is supplied to the top surface of wafer W by nozzle 33a. As a result, the DIW liquid that remains on the top surface of wafer W is removed to dry wafer W. During this period, the atmosphere in outer chamber 31 is discharged through individual exhaust path 35 and first exclusive common exhaust path 61. Further, the IPA liquid is scattered in outer chamber 31 by the rotation of wafer W. As a result, the atmosphere in outer chamber 31 is discharged together with the mist of the IPA liquid.

Therefore, the liquid processing of wafer W is terminated.

However, each step of the liquid processing in each liquid processing unit 3 is performed at the timing for each liquid processing unit 3. That is, the timings of the alkaline chemical liquid processing, the acid chemical liquid processing, and the drying processing in each liquid processing unit 3 are not matched with each other, and as a result, the switching states of each flow path switching mechanism 5 may be different from each other. For example, flow path switching mechanism 5 corresponding to liquid processing unit 3A may connect liquid processing unit 3A to first exclusive common exhaust path 61 and flow path switching mechanism 5 corresponding to liquid processing unit 3B may connect liquid processing unit 3B to second exclusive common exhaust path 62.

Therefore, in the exemplary embodiment, while wafer W is liquid-processed, the opening degrees of injection amount adjusting valves V11 to V13 adjusting the flow rate of the air injected into each exclusive common exhaust paths 61 to 63 are adjusted based on the switching state of each flow path switching mechanism 5. Specifically, for example, controller 100 controls first injection amount adjusting valve V11 to increase the opening degree of first injection amount adjusting valve V11 as the number of liquid processing units 3 connected to first exclusive common exhaust path 61 decreases. Controller 100 also controls second injection amount adjusting valve V12 and third injection amount adjusting valve V13 in the same manner as above. As a result, the flow rate of the air injected into each of exclusive common exhaust paths 61 to 63 from each air injecting port 65 is adjusted and the exhaust amount from each outer chamber 31 is prevented from fluctuating.

After the liquid processing of wafer W is terminated, wafer W is replaced (step S8). In this case, first, wafer carry in-out port 31e of outer chamber 31 is opened and transportation arm 24 enters the inside of outer chamber 31 and processed wafer W is carried out. Carried-out wafer W is transferred to rack unit 23 and received in the carrier on placing stand 21 by transportation arm 22. Thereafter, unprocessed wafer W is carried into liquid processing unit 3 in the same manner as step S1 and liquid-processed to consecutively liquid-process plural wafers W.

However, while wafer W is liquid-processed in each liquid processing unit 3, opening-closing panel 31c may be opened for the purpose of internally checking outer chambers 31 of some liquid processing units 3. In this case, first, panel detecting unit 31d provided in outer chamber 31 detects that opening-closing panel 31c is opened. Next, flow path switching mechanism 5 is controlled to open individual exhaust path 35 corresponding to outer chamber 31, that is, to allow outer chamber 31 of liquid processing unit 3 and one of each exclusive common exhaust paths 61 to 63 to be in communication with each other. Thereafter, controller 100 controls the switching state of flow path switching mechanism 5 as described above to reflect the switching state to the adjustment of the opening degrees of injection amount adjusting valves V11 to V13. Further, as described above, since internal and external pressures of outer chamber 31 are maintained at the same pressure, exhaust control may be performed with respect to other liquid processing units 3 similarly as a closed state of opening-closing panel 31c even while opening-closing panel 31c is opened. That is, although opening-closing panels 31c of some liquid processing units are opened, the opening does not influence other liquid processing units.

According to the exemplary embodiment as described above, air injecting port 65 injecting air is provided and injection amount adjusting valves V11 to V13 adjusting an injection amount of the air injected from air injecting port 65 are provided, on each of exclusive common exhaust paths 61 to 63, and the opening degree of each of injection amount adjusting valves V11 to V13 is controlled based on the switching state of each flow path switching mechanism 5. As a result, the timings of the alkaline chemical liquid processing, the acid chemical liquid processing, and IPA drying processing in each liquid processing unit 3 are not matched with each other, such that although the switching states of flow path switching mechanisms 5 are different from each other, the exhaust amount from outer chamber 31 of each liquid processing unit 3 can be prevented from fluctuating by adjusting the flow rate of the air injected from air injecting port 65. Therefore, the internal pressure of each outer chamber 31 can be prevented from fluctuating and decreasing. In this case, for example, it is possible to prevent the cleanliness from being deteriorated because the internal pressure of outer chamber 31 decreases to allow the air to be injected into outer chamber 31.

Further, according to the exemplary embodiment, for example, when opening-closing panel 31c of liquid processing unit 3 is opened for the purpose of internally checking outer chamber 31 of liquid processing unit 3, panel detecting unit 31d detects the opening, and as a result, corresponding flow path switching mechanism 5 is controlled to allow outer chamber 31 of the corresponding liquid processing unit 3 and one of exclusive common exhaust paths 61 to 63 to be in communication with each other. Therefore, air supplied from fan filter unit 7 may be discharged to individual exhaust paths 35. Further, based on the switching state of each flow path switching mechanism 5 including flow path switching mechanism 5, the opening degrees of injection amount adjusting valves V11 to V13 are adjusted. As a result, for example, although opening-closing panel 31c of one liquid processing unit 3 is opened, the exhaust amounts from outer chambers 31 of other liquid processing units 3 can be prevented from fluctuating and the internal pressures of outer chambers 31 of other liquid processing units 3 can be prevented from being fluctuated. In this case, for example, wafer W may be liquid-processed in other liquid processing unit 3 while one liquid processing unit 3 is internally checked.

As described above, although the exemplary embodiments of the present disclosure have been described, various modifications may also be made without departing from the scope of the present disclosure. Hereinafter, a representative modified example will be described.

That is, in the exemplary embodiments of the present disclosure, an example has been described in which exclusive common exhaust paths 61 to 63 are connected with each liquid processing unit 3 through individual exhaust paths 35. However, the present disclosure is not limited thereto. For example, individual exhaust path 35 includes a plurality of exclusive individual exhaust paths (not shown) discharging the atmosphere in outer chamber 31 for each kind of the processing liquid supplied to wafer W in liquid processing unit 3, and each of corresponding exclusive common exhaust paths 61 to 63 may be connected to each liquid processing unit 3 through each of the exclusive individual exhaust paths. In this case, an opening-closing valve (not shown) which can open and close is provided on each of the exclusive individual exhaust paths and flow path switching mechanism 5 may be constituted by three (3) opening-closing valves.

Further, in the exemplary embodiments of the present disclosure, an example has been described in which three (3) exclusive common exhaust paths 61 to 63 are provided according to three (3) kinds of processing liquids and opening-closing mechanism 5 switches and connects a corresponding liquid processing unit 3 to one of the exclusive common exhaust paths 61 to 63 corresponding to the processing liquid. However, the present disclosure is not particularly limited thereto. For example, common exhaust path 6 is constituted even by a single exclusive common exhaust path and opening-closing mechanism 5 may be configured to merely open and close individual exhaust path 35, that is, a flow path between liquid processing unit 3 and single exclusive common exhaust path. In this case, controller 100 may control the opening degree of a corresponding single injection amount adjusting valve based on the switching state of flow path switching mechanism 5.

Further, in the exemplary embodiments of the present disclosure, although the example has been described in which common exhaust path 6 is constituted by three (3) exclusive common exhaust paths 61 to 63, common exhaust path 6 may be constituted by two, and four or more exclusive common exhaust paths according to the number of the kinds of the processing liquids used in liquid processing unit 3.

In addition, in the exemplary embodiments of the present disclosure, the example in which air injecting port 65 and each of injection amount adjusting valves V11 to V13 is placed at the exhaust-direction upstream side of confluences 66a to 66e of the exhausted air from each liquid processing unit 3 has been described. However, the present disclosure is not particularly limited thereto. For example, air injecting port 65 and each of injection amount adjusting valves V11 to V13 may be placed at a predetermined position of each of corresponding exclusive common exhaust paths 61 to 63. In this case, an uppermost end of each of exclusive common exhaust paths 61 to 63 is closed.

Further, in the exemplary embodiments of the present disclosure, the example in which the SC1 liquid is used as the alkaline chemical liquid, the DHF liquid is used as the acid chemical liquid, the DIW liquid is used as the rinse liquid, and the IPA liquid is used as the organic chemical liquid has been described. However, the present disclosure is not particularly limited thereto. For example, ammonia water may be used as the alkaline chemical liquid and hydrogen fluoride (HF) or SC2 (a mixture of hydrochloric acid and hydrogen peroxide) may be used as the acid chemical liquid. Further, other processing liquids that are generally used may be used as each processing liquid in addition to the rinse liquid and the organic chemical liquid.

Further, in the above description, the example in which the liquid processing apparatus, the liquid processing method, and the recording medium having the computer program for performing the same method according to the exemplary embodiments of the present disclosure are applied to the washing processing of semiconductor wafer W has been described. However, the present disclosure is not particularly limited thereto and the present disclosure may be applied to the washing of various substrates (objects to be processed) such as an LCD substrate or a CD substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus, comprising:
   a plurality of liquid processing units each configured to supply a processing liquid to an object to be processed and liquid-process the object;
   a common exhaust path configured to discharge atmospheres of the plurality of liquid processing units, wherein each of the plurality of liquid processing units has an individual exhaust path connecting it to the common exhaust path, and wherein each individual exhaust path has an opening-closing mechanism configured to open and close that individual exhaust path;
   an air injecting port provided in the common exhaust path and configured to inject air into the common exhaust path;
   an injection amount adjusting valve provided in the common exhaust path and configured to adjust the flow rate of the air injected from the air injecting port; and
   a controller programmed and configured to suppress pressure fluctuations in the plurality of liquid processing units by controlling an opening degree of the injection amount adjusting valve based on the number of open opening-closing mechanisms.

2. The liquid processing apparatus of claim 1, wherein the injection amount adjusting valve is placed at an exhaust-direction upstream side of a confluence of the exhausted air from each of the liquid processing units on the common exhaust path.

3. The liquid processing apparatus of claim 1, further comprising a single gas supplying unit to supply gas to each of the liquid processing units.

4. The liquid processing apparatus of claim 1, wherein:
   each of the liquid processing units includes a liquid processing container forming a liquid processing space where the object is liquid-processed, an opening-closing panel provided in the liquid processing container to be openable and capable of opening the liquid processing space, and a panel detecting unit configured to detect the opening and closing of the opening-closing panel, and
   when the panel detecting unit detects that the opening-closing panel is opened, the controller controls the corresponding opening-closing mechanism to be opened.

5. A liquid processing method of liquid-processing an object to be processed by using a liquid processing apparatus including a plurality of liquid processing units each configured to supply a processing liquid to the object and liquid-process the object, a common exhaust path configured to discharge atmospheres of the plurality of liquid processing units, wherein each of the plurality of liquid processing units has an individual exhaust path connecting it to the common exhaust path, and wherein each individual exhaust path has an opening-closing mechanism configured to open and close that individual exhaust path, an air injecting port provided in the common exhaust path and configured to inject air into the common exhaust path, and an injection amount adjusting valve provided in the common exhaust path and configured to adjust the flow rate of the air injected from the air injecting port, the method comprising:
   carrying the object into at least one of the liquid processing units; and
   liquid-processing the object by supplying the processing liquid to the object in the at least one of the liquid processing units into which the object is carried,
   wherein in the liquid-processing of the object, the atmospheres of one of the liquid processing units is discharged through the individual exhaust path associated with the one of the liquid processing units and the common exhaust path, and a controller is programmed and configured to adjust an opening degree of the injection amount adjusting valve based on the number of open opening-closing mechanisms in order to suppress pressure fluctuations in the plurality of liquid processing units.

6. The liquid processing method of claim 5, wherein the injection amount adjusting valve is placed at an exhaust-direction upstream side of a confluence of the exhausted air from each of the liquid processing units on the common exhaust path.

7. The liquid processing method of claim 5, wherein in the liquid-processing of the object, gas is supplied from a single gas supplying unit to each of the liquid processing units.

8. The liquid processing method of claim 5, wherein:
   each of the liquid processing units includes a liquid processing container forming a liquid processing space where the object is liquid-processed, an opening-closing panel provided in the liquid processing container to be openable and capable of opening the liquid processing space, and a panel detecting unit configured to detect the opening and closing of the opening-closing panel, and
   in the liquid-processing of the object, when the panel detecting unit detects that the opening-closing panel is opened, the corresponding opening-closing mechanism is controlled to be opened.

9. A recording medium having a computer program for performing a liquid processing method, wherein:
   the liquid processing method includes carrying an object to be processed into at least one of a plurality of liquid processing units and liquid-processing the object by supplying a processing liquid to the object in the at least one of a plurality of liquid processing units into which the object is carried, by using a liquid processing apparatus including the plurality of liquid processing units each configured to supply the processing liquid to the object and liquid-process the object, a common exhaust path configured to discharge atmospheres of the plurality of liquid processing units, wherein each of the plurality of liquid processing units has an individual exhaust path connecting it to the common exhaust path, and wherein each individual exhaust path has an opening-closing mechanism configured to open and close that individual exhaust path, wherein an air injecting port is provided in the common exhaust path and configured to inject air into the common exhaust path, and wherein an injection amount adjusting valve is provided in the common exhaust path and configured to adjust the flow rate of the air injected from the air injecting port, and in the liquid-processing of the object, the atmospheres of the at least one of a plurality of liquid processing units is discharged through the corresponding individual exhaust path and the common exhaust path, and an opening degree of the injection amount adjusting valve is adjusted based on the number of open opening-closing mechanisms in order to suppress pressure fluctuations in the plurality of liquid processing units.

10. A liquid processing apparatus comprising:

a plurality of liquid processing units each configured to selectively supply one of a plural kinds of processing liquid to an object to be processed and liquid-process the object;

a plurality of process-specific exhaust paths configured to discharge atmospheres of the plurality of liquid processing units, each of the process-specific exhaust paths dedicated to exhausting atmospheres associated with one of the plural kinds of processing liquids, each of the process-specific exhaust paths connected to each liquid processing unit by an individual exhaust path with an opening-closing mechanism and flow path switching mechanism, such that during a specific liquid-processing of an object:

the liquid processing unit conducting that process will discharge its atmosphere through the process-specific exhaust path associated with that specific process via the individual exhaust path between that liquid processing unit and that process-specific exhaust path, with the flow path switching mechanism of that individual exhaust path opening the opening-closing mechanism of that individual exhaust path, wherein the liquid processing apparatus further comprises a plurality of air injecting ports, one being provided on each of the process-specific exhaust paths to inject air into that process-specific exhaust path, and wherein each air injecting port is provided with an injection amount adjusting valve to adjust the flow rate of the air being injected; and a controller programmed and configured to suppress pressure fluctuations in the plurality of liquid processing units by controlling the opening degree of one of the injection amount adjusting valves based on the number of the open-closing mechanisms that are open.

11. The liquid processing apparatus of claim 10, wherein the injection amount adjusting valve associated with each process-specific exhaust path is placed at an exhaust-direction upstream side of a confluence of the exhausted air from each of the liquid processing units on that process-specific exhaust path.

12. The liquid processing apparatus of claim 10, further comprising a single gas supplying unit to supply gas to each of the liquid processing units.

13. The liquid processing apparatus of claim 10, wherein:

each of the liquid processing units includes a liquid processing container forming a liquid processing space where the object is liquid-processed, an opening-closing panel provided in the liquid processing container to be openable and capable of opening the liquid processing space, and a panel detecting unit configured to detect the opening and closing of the opening-closing panel, and when the panel detecting unit detects that the opening-closing panel is opened, the controller controls the corresponding opening-closing mechanism to be opened.

* * * * *